United States Patent
Lee et al.

(10) Patent No.: US 7,817,471 B2
(45) Date of Patent: Oct. 19, 2010

(54) FLASH MEMORY DEVICE AND PROGRAMMING METHOD

(75) Inventors: You-Sang Lee, Seoul (KR); Yoon-Hee Choi, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 112 days.

(21) Appl. No.: 12/208,574

(22) Filed: Sep. 11, 2008

(65) Prior Publication Data
US 2009/0080256 A1 Mar. 26, 2009

(30) Foreign Application Priority Data
Sep. 21, 2007 (KR) .................. 10-2007-0096338

(51) Int. Cl.
*G11C 16/04* (2006.01)
(52) U.S. Cl. .................. 365/185.11; 365/185.18; 365/230.03; 365/189.09
(58) Field of Classification Search ............ 365/185.11, 365/185.18, 230.03, 189.06–189.07, 189.09
See application file for complete search history.

(56) References Cited

U.S. PATENT DOCUMENTS 6,438,033 B2 * 8/2002 Roohparvar ........... 365/185.18
7,512,010 B2 * 3/2009 Cho et al. ............... 365/185.23

FOREIGN PATENT DOCUMENTS

| JP | 2003223791 A | 8/2003 |
| KR | 100648295 B1 | 11/2006 |
| KR | 1020070039767 A | 4/2007 |
| KR | 1020070054008 A | 5/2007 |

* cited by examiner

*Primary Examiner*—David Lam
(74) *Attorney, Agent, or Firm*—Volentine & Whitt, PLLC

(57) ABSTRACT

Provided are a flash memory device and method of controlling certain program operation voltages. The flash memory device includes a high voltage generation circuit providing a high voltage to a block selection circuit and a program voltage to a row decoder. The high voltage generation circuit includes a charge pump, a high voltage control circuit controlling the charge pump to provide the high voltage, and a program voltage control circuit providing the program voltage in relation to the high voltage, wherein the high voltage control circuit and the program voltage control circuit operate in response to the same control code.

17 Claims, 8 Drawing Sheets

FLASH MEMORY DEVICE AND PROGRAMMING METHOD

CROSS-REFERENCE TO RELATED APPLICATIONS

This U.S. non-provisional patent application claims priority under 35 U.S.C. §119 to Korean Patent Application No. 10-2007-0096338 filed on Sep. 21, 2007, the subject matter of which is hereby incorporated by reference.

BACKGROUND

The present invention relates to a semiconductor memory device, and more particularly, to a flash memory device and a programming method for the flash memory device.

Semiconductor memories may be classified into random access memories (RAM) and read only memories (ROM). RAM is generally volatile in nature. That is, data stored in RAM is lost when power is interrupted. ROM is generally non-volatile in nature and retains stored data when power is interrupted. RAM includes the dynamic RAM (DRAM) and static RAM (SRAM). ROM includes the programmable ROM (PROM), erasable PROM (EPROM), electrically EPROM (EEPROM), and a flash memory. Flash memory may be further classified into NAND flash memory and NOR flash memory. NAND flash memory has a higher level of device integration relative to NOR flash memory.

FIG. 1 is a block diagram of a conventional flash memory device. Additional background information regarding conventional flash memory devices may be had by reviewing the subject mater of Korean Patent Publication No. 10-2006-0131507. Referring to FIG. 1, flash memory device 100 includes a memory cell array 110, a word line decoder 120, and a high voltage generator 130. The memory cell array 110 includes a plurality of memory blocks, each of which is connected to the word line decoder 120. Only one memory block and one word line decoder 120 are illustrated in FIG. 1, amongst the typical plurality of such elements included with flash memory devices.

The memory cell array 110 includes a plurality of memory strings CS respectively connected to "n" bit lines BL0 to BLn−1. The memory strings CS are connected to a common source line CSL. Gates of memory cells M0 to M15 of the memory strings CS are respectively connected to word lines WL0 to WL15. The gates of string selection transistors SST connecting the memory strings CS to the bit lines BL0 to BLn−1, respectively are connected to a string selection line SSL. The gates of ground selection transistors GST connecting each of the memory strings CS to the common source line CSL are connected to a ground selection line GSL.

The word line decoder 120 selectively activates the string selection line SSL, the ground selection line GSL, and the word lines WL0 to WL15 in the memory cell array 110. The word line decoder 120 includes a word line driver 124 receiving address signals (ADDR) and providing word line drive signals S0 to S15, a string selection voltage VSSL, and a ground selection voltage VGSL to the word lines WL0 to WL15, the string selection line SSL, and the ground selection line GSL, respectively.

The decoder 122 decodes the received address signals (ADDR) in order to provide corresponding drive voltages (e.g., a program voltage (Vpgm), an erase voltage Verase, a read voltage Vread, or a pass voltage Vpass) to the string selection line SSL, the word lines WL0 to WL15, and the ground selection line GSL during a program operation, an erase operation, or a read operation.

The word line driver 124 includes high voltage pass transistors SN, WN0 to WN15, GN, and CN, connected between the string selection voltage VSSL, the word line drive signals S0 to S15, the ground selection voltage VGSL, and the common source line voltage VCSL, and the string selection line SSL, the word lines WL0 to WL15, the ground selection line GSL, and the common source line CSL, respectively. A high voltage VPP generated from the high voltage generator 130 is connected to a block word line BLKWL to which the gates of the high voltage pass transistors SN, WN0 to WN15, GN, and CN are connected.

Once a pumping clock CLK_VPP is applied, the high voltage generator 130 generates a high voltage VPP during a charge pumping operation.

During a program operation of the flash memory device 100, to provide a program voltage to the word lines WL0 to WL15, the voltage difference between a high voltage and a program voltage should be greater than each threshold voltage of the high voltage pass transistors SN, WN0 to WN15, GN, and CN. However, if the voltage difference between a high voltage and a program voltage is too high, unnecessary power consumption occurs and the high voltage pass transistors SN, WN0 to WN15, GN, and CN may become damage by the overly high voltage. In contrast, if the voltage difference between a high voltage and a program voltage is too low, the high voltage pass transistors SN, WN0 to WN15, GN, and CN may not be turned ON, and the program voltage will not be provided to the word lines WL0 to WL15.

During a program operation performed by the flash memory device 100, the program voltage is typically increased by defined increments. The conventional flash memory device 100 controls the applied high voltage signal in order to maintain a level greater than the highest level of the program voltage (i.e., the value of the program voltage following its final increment). Unfortunately, because the high voltage signal is maintained at this level regardless of the program voltage actually used during a current program operation, unnecessary power consumption occurs and the high voltage pass transistors SN, WN0 to WN15, GN, and CN may become damaged by the unnecessarily elevated high voltage signal.

SUMMARY

Embodiments of the invention provide a flash memory device capable of uniformly maintaining the voltage difference between a high voltage and a program voltage by controlling the high voltage and the program voltage in relation to the same control code applied to a high voltage control circuit and a program voltage control circuit. In certain embodiments of the invention, the high voltage control circuit and the program voltage control circuit may have the same circuit configuration.

In one embodiment, the invention provides a flash memory device comprising; a memory cell array having a plurality of memory blocks, a row decoder providing a program voltage to a selected word line, a block selection circuit connected between the memory cell array and the row decoder to select at least one of the plurality of memory blocks, and a high voltage generation circuit providing a high voltage to the block selection circuit and providing a program voltage to the row decoder. The high voltage generation circuit comprises; a charge pump, a high voltage control circuit controlling the charge pump to provide the high voltage, and a program voltage control circuit providing the program voltage in relation to the high voltage, wherein the high voltage control circuit and the program voltage control circuit operate in response to a control code.

In another embodiment, the invention provides a method of controlling the generation of a high voltage and corresponding program voltage in a flash memory device, the method comprising; generating the high voltage higher than a power supply voltage in response to received control code, and deriving the program voltage from the high voltage with a defined voltage difference between the program voltage and high voltage in response to the control code.

In another embodiment, the invention provides a memory system comprising; a memory controller configured to provide a control signal and further configured to control the operation of a flash memory device. The flash memory device comprises; control logic receiving the control signal and generating corresponding control code, a memory cell array having a plurality of memory blocks, a row decoder providing a program voltage to a selected word line, a block selection circuit connected between the memory cell array and the row decoder to select at least one of the plurality of memory blocks, and a high voltage generation circuit providing a high voltage to the block selection circuit and providing a program voltage to the row decoder. The high voltage generation circuit comprises; a charge pump, a high voltage control circuit controlling the charge pump to provide the high voltage in response to the control code, and a program voltage control circuit providing the program voltage in relation to the high voltage in response to the control code.

DESCRIPTION OF EMBODIMENTS

A flash memory device according to an embodiment of the invention generally includes a high voltage generation circuit that maintains a defined voltage difference between a high voltage and a program voltage, where the program voltage is incrementally increased during a program operation. Additionally, a flash memory device according to an embodiment of the invention includes a high voltage generation circuit configured to maintain the defined voltage difference between the high voltage and program voltage. In certain embodiments of the invention, the high voltage generation circuit includes a high voltage control circuit and a program voltage control circuit having the same structure and controlling the high voltage and program voltage in response to the same control code signal or control code data, hereafter referred to as "control code" regardless of its form and method of provision.

Hereinafter, embodiments of the invention will be described in some additional detail with reference to the accompanying drawings. Throughout the drawings and written description, like reference numbers and indicators are used to denote like or similar elements. In should be noted, however, the present invention may be variously embodied and the invention is not limited to only the illustrated embodiments.

Figure 1:
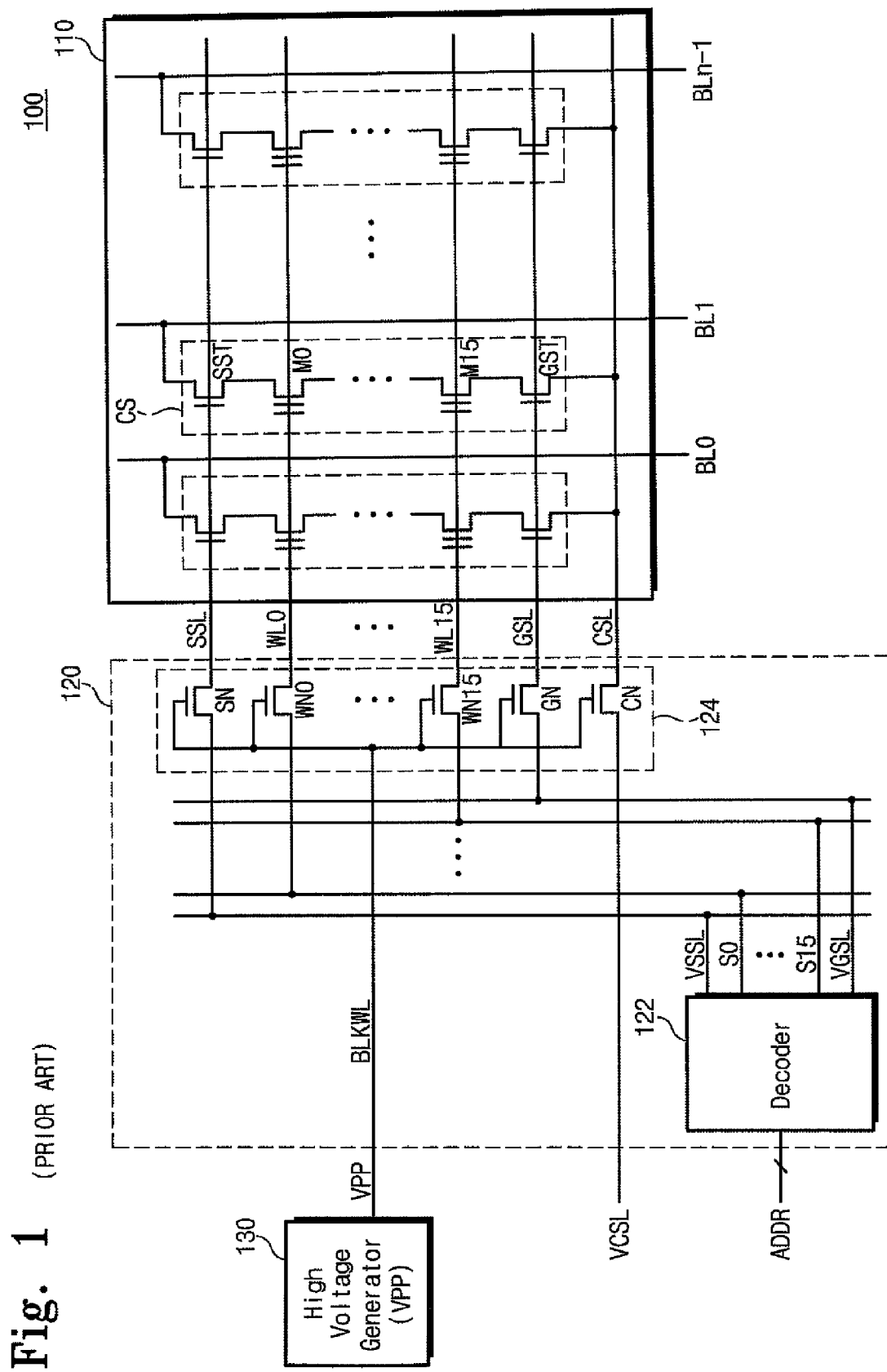
FIG. 1 is a block diagram of a conventional flash memory device.
Figure 2:
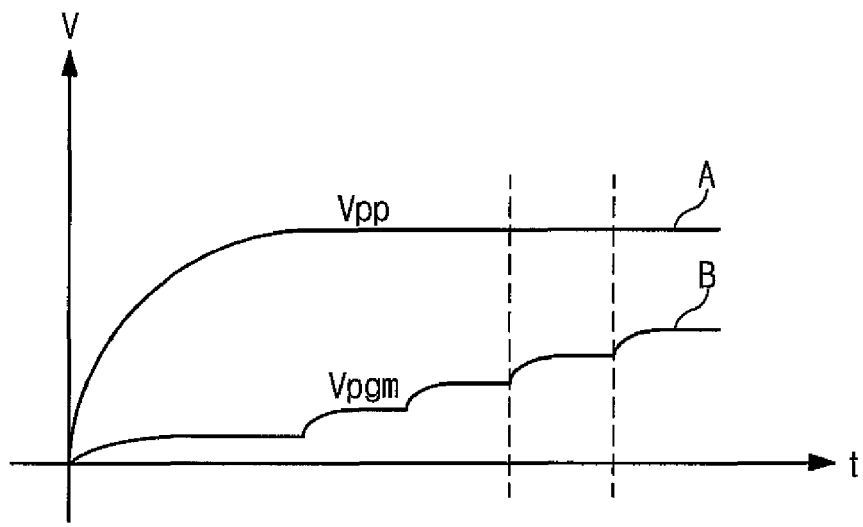
FIG. 2 is a graph illustrating a method of controlling a high voltage and a program voltage during a program operation performed by a conventional flash memory device.

FIG. 2 is a graph illustrating a method of controlling a high voltage and a program voltage during a program operation being executed in a conventional flash memory device. Referring to FIG. 2, the program voltage (Vpgm) indicated by graph line B is incrementally increased over a number of time periods, typically corresponding to a plurality of sequentially applied programming loops. In contrast, the high voltage (Vpp) indicated by the graph line A rises quickly upon initiation of the program operation and thereafter is maintained at a predetermined level regardless of the current level of the program voltage (Vpgm). In this context, the term "current level of the program voltage" means the actual level of the program voltage at any given moment in time (e.g., during a current programming loop).

As previously noted, so long as the voltage difference between the high voltage (Vpp) and the program voltage (Vpgm) is greater than a defined minimum difference, the program operation being executed by the flash memory device will proceed normally. However, as may be seen from FIG. 2, the conventional flash memory device maintains high voltage (Vpp) at an overly high level with respect to the earlier programming loops of the program operation where the program voltage is relatively low (i.e., where the program voltage has not been incremented very many times from its initial level). Accordingly, power is unnecessarily consumed by the flash memory device in the provision of an overly high voltage (Vpp). This overly high voltage unnecessarily stresses certain transistors within the flash memory device and may actually cause damage.

Figure 3:
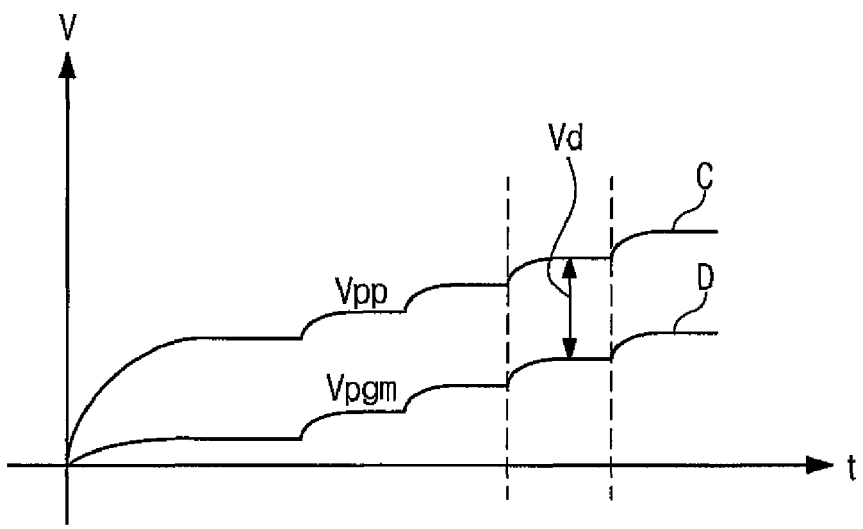
FIG. 3 is a graph illustrating one exemplary method of controlling a high voltage and a program voltage according to an embodiment of the invention.

FIG. 3 is a graph illustrating a method of controlling a high voltage and a program voltage according to an embodiment of the invention. Referring to FIG. 3, a program voltage (Vpgm) indicated by graph line D is conventionally incremented over a sequence of time periods associated with, for example, successive programming loops in a program operation. However, a high voltage (Vpp) indicated by graph line C instead of being provisioned a fixed level is also similarly incremented over the sequence of time periods. The substantially simultaneous and incremental increase of both high voltage (Vpp) and the program voltage (Vpgm) over the sequence of time periods maintains a defined voltage difference (Vd). Thus, when the program voltage (Vpgm) is relatively low at during early time periods in the sequence, the high voltage (Vpp) is also relatively low, albeit greater than the program voltage (Vpgm) by at least the defined voltage difference (Vd). In this manner, unnecessary power consumption is prevented, and possible damage to certain high voltage transistors within the flash memory device is avoided.

Figure 4:
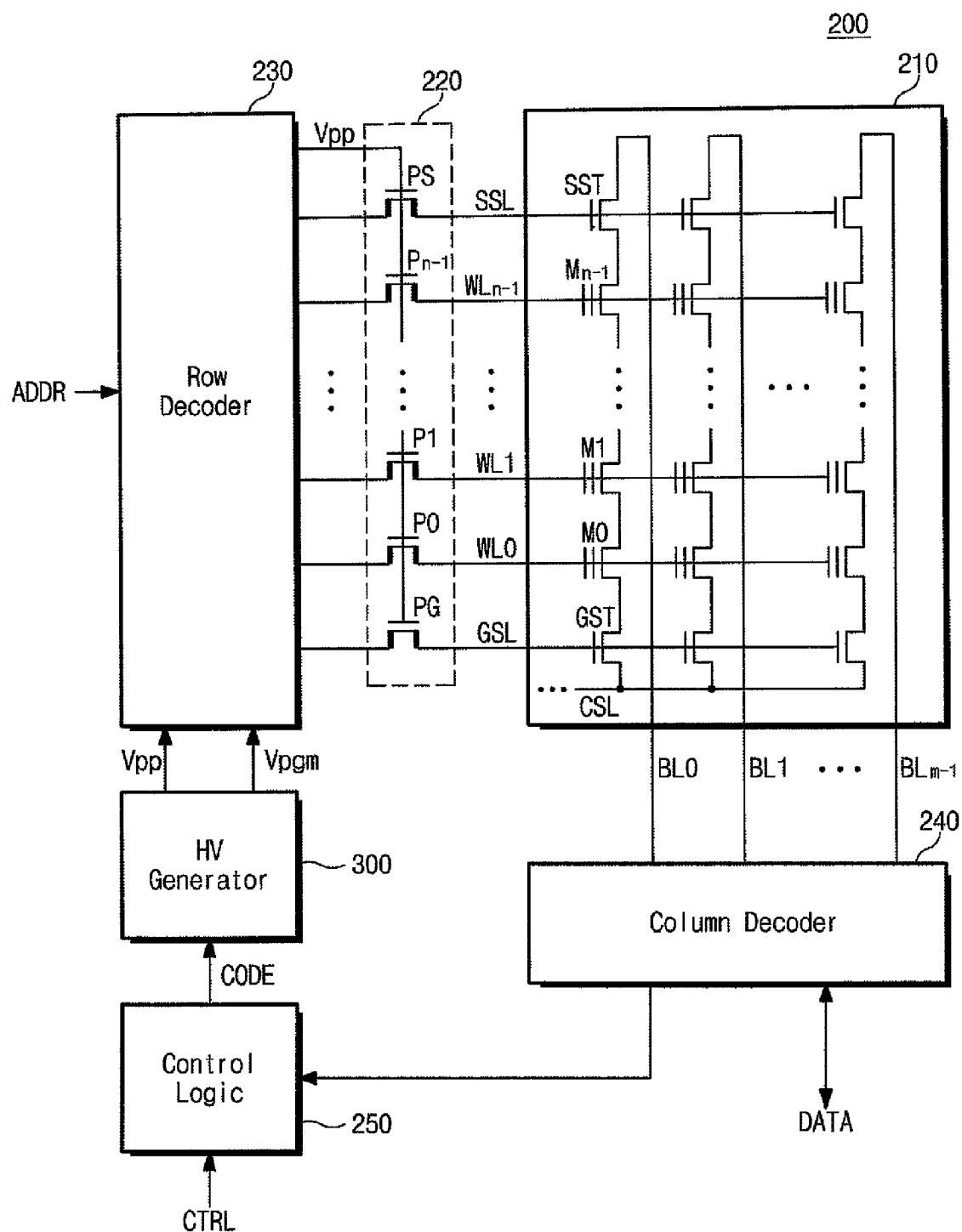
FIG. 4 is a block diagram of a flash memory device according to an embodiment of the invention.

FIG. 4 is a block diagram of a flash memory device according to an embodiment of the invention. Referring to FIG. 4, a NAND flash memory device 200 generally comprises a memory cell array 210, a block selection circuit 220, a row decoder 230, a column decoder 240, a control logic 250, and a high voltage (HV) generation circuit 300.

The memory cell array 210 includes a plurality of memory blocks. Only one memory block is illustrated in FIG. 4 to retain clarity of explanation. Each memory block includes a plurality of pages. Each page includes a plurality of memory cells M0 to Mn−1. In flash memory device 200, it is assumed that the memory block is an erasable unit, and that the page is readable or writable (programmable) unit.

Each memory block includes a plurality of cell strings. Each cell string includes a ground selection transistor GST, a plurality of memory cells M0 to Mn−1, and a string selection transistor SST. The ground selection transistor GST is connected to a ground selection line GSL. The memory cells M0 to Mn−1 are connected to word lines WL0 to WLn−1. The string selection transistor SST is connected to the string selection line SSL. The cell string is connected between corresponding bit line (e.g., BL1) and the common source line CSL.

The block selection circuit 220 is connected between the cell array 210 and the row decoder 230. The block selection circuit 220 includes a plurality of block selection transistors PG, P0 to Pn−1, and PS. The block selection circuit 220 manages a connection between the row decoder 230 and the memory cell array 210 in response to a control of the row decoder 230.

The high voltage (Vpp) and program voltage (Vpgm) are applied to the block selection transistors PG, P0 to Pn−1, and PS. Because the high voltage (Vpp) and program voltage (Vpgm) are relatively high voltage signals within the context of flash memory components, each of the block selection transistors PG, P0 to Pn−1, and PS is a high voltage transistor. Although the high voltage transistor is designed to be protected against these high voltage signals, it may yet become damaged if a voltage greater than its break voltage is applied or if a high voltage is continuously applied.

The row decoder 230 is connected to the memory cell array 110 through the block selection circuit 220. The row decoder 230 receives an address (ADDR) and selects at least one memory block in the memory cell array 210 through the block selection circuit 220. The row decoder 230 applies the high voltage (Vpp) provided from the high voltage generation circuit 300 into gates of the block selection transistors PG, P0 to Pn−1, and PS connected to the selected memory block. The row decoder 230 applies a read voltage or a pass voltage to the ground selection line GSL, the word lines WL0 to WLn−1, and the string selection line SSL through the block selection circuit 220. During a program operation of the flash memory device 200, the row decoder 230 applies the program voltage (Vpgm) provided from the high voltage generation circuit 300 into the selected word line.

The column decoder 240 is connected to the memory cell array 210 through the bit lines BL1 to BLm−1. The column decoder 240 selects a bit line during a write or read operation. The data to be stored in the memory cell array 210 or the data read from the memory cell array 210 are communicated with the outside through the column decoder 240. During a program operation, the program voltage (Vpgm) is incrementally increased. That is, each time a programming loop within a defined sequence of programming loops is completed during the program operation, the column decoder 240 performs a verify operation in response to the control logic 250.

The control logic 250 receives a control signal (CTRL) from an external circuit (e.g., a host device, memory controller, CPU, etc.) and generates corresponding control code (CODE). The code signal (CODE) is provided to the high voltage generation circuit 300. The code signal (CODE) controls the high voltage generation circuit 300 to generate the high voltage (Vpp) and program voltage (Vpgm) at desired levels. During a program operation, the control logic 250 controls the high voltage generation circuit 300 to incrementally increase the program voltage (Vpgm). Once each programming loop of the program operation is completed, the control logic 250 performs a verify operation using the column decoder 240. If a memory cell is not properly programmed during the current programming loop, as identified by the verify operation results, the control logic 250 controls the high voltage generation circuit 300 to increase the program voltage (Vpgm) during the next programming loop.

The high voltage generation circuit 300 generates the high voltage (Vpp) and the program voltage (Vpgm) in response to the control code (CODE) provide by the control logic 250. As illustrated in FIG. 3, the high voltage (Vpp) and the program voltage (Vpgm), as generated by the high voltage generation circuit 300, are maintain at stable voltage difference (Vd) relative to each other. In order to form a signal connection between the memory cell array 210 and the row decoder 230, the voltage difference (Vd) between the high voltage (Vpp) and the program voltage (Vpgm) must be greater than the respective threshold voltages for the block selection transistors PG, P0 to Pn−1, and PS.

Figure 5:
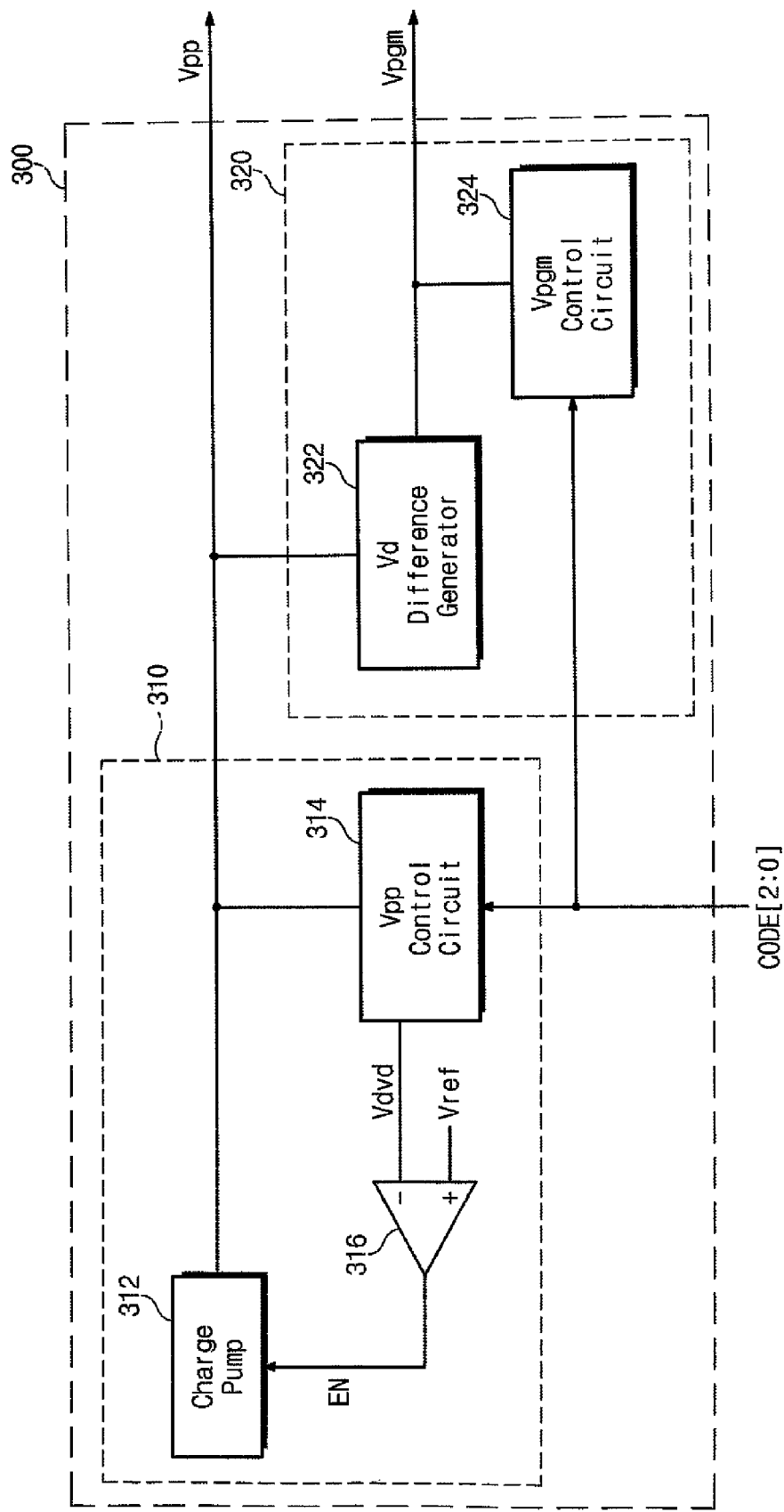
FIG. 5 is a block diagram further illustrating the high voltage generation circuit of FIG. 4.

FIG. 5 is a block diagram further illustrating the high voltage generation circuit 300 of FIG. 4. In the illustrated example of FIG. 5, the high voltage generation circuit 300 comprises a high voltage generator 310 and a program voltage generator 320.

The high voltage generator 310 generates the high voltage (Vpp) in response to at least a portion of the control code (e.g., CODE[2:0]). The high voltage generator 310 comprises a charge pump 312, a high voltage (VPP) control circuit 314, and a comparator 316. The charge pump 312 generates the high voltage (Vpp) using a conventionally understood charge pumping operation in response to a received enable signal (EN) provided by the comparator 316. The high voltage control circuit 314 divides the high voltage (Vpp) provided by the charge pump 312 in response to the control code (CODE[2:0]). The resulting divided voltage (Vdvd), hereinafter, referred to as the division voltage, is provided to the comparator 316. The comparator 316 compares a reference voltage (Vref) with the division voltage (Vdvd) provided by the high voltage control circuit 314 and generates the enable signal (EN) in response to the comparison.

If the high voltage (Vpp) is less than a minimal voltage level required for proper operation of the flash memory device 200, the charge pump 312 performs a pumping operation in response to the enable signal (EN). Accordingly, the level of the high voltage (Vpp) generated by the charge pump 312 is increased. Once the high voltage (Vpp) rises to the minimal voltage level required for proper operation of the flash memory device 200, the charge pump 312 stops the pumping operation. Therefore, the high voltage (Vpp) generated by the charge pump 312 is first controlled in relation to a minimal voltage level required for proper operation of the flash memory device 200.

The program voltage generator 320 generates the program voltage (Vpgm) using the high voltage (Vpp) provided by the high voltage generator 310. The program voltage generator 320 includes a voltage difference generator 322 and a program voltage (Vpgm) control circuit 324. The voltage difference generator 322 receives the high voltage (Vpp) and provides the program voltage (Vpgm) at a level less than the high voltage (Vpp) by the defined voltage difference (Vd). The voltage difference (Vd) provided by the voltage difference generator 322 is controllable. The voltage difference (Vd)

provided by the voltage difference generator 322 must be greater than the respective threshold voltages for the block selection transistors PG, P0 to Pn−1, and PS of FIG. 4. However, due to conventionally understood process variables associated with the fabrication and operation of flash memory devices, the respective threshold voltages of the block selection transistors PG, P0 to Pn−1, and PS may vary. Accordingly, to properly operate the flash memory device regardless of such inevitable process variables, a variable voltage difference (Vd) is provided in certain embodiments of the invention. That is, the program voltage control circuit 324 controls the level of the program voltage (Vpgm) provided by the voltage difference generator 322 such that it is maintained above a minimal voltage level required for proper execution of the program operation within the flash memory device 200 and in response to the applied control code (CODE[2:0]).

In a one embodiment of the invention, the voltage difference generator 322 comprises a plurality of series-connected diodes. The voltage difference (Vd) defined and provided by the voltage difference generator 322 may be controlled in relation to the plurality of series-connected diodes. That is, the voltage difference (Vd) may be controlled by adjusting the number of activated diodes through metal options for the diode during the testing of the flash memory device at the wafer level, for example. In this manner, the program voltage (Vpgm) provided from the voltage difference generator 332 will have a level less than the high voltage (Vpp), according to the sum of the threshold voltages of the activated diodes.

Figure 6:
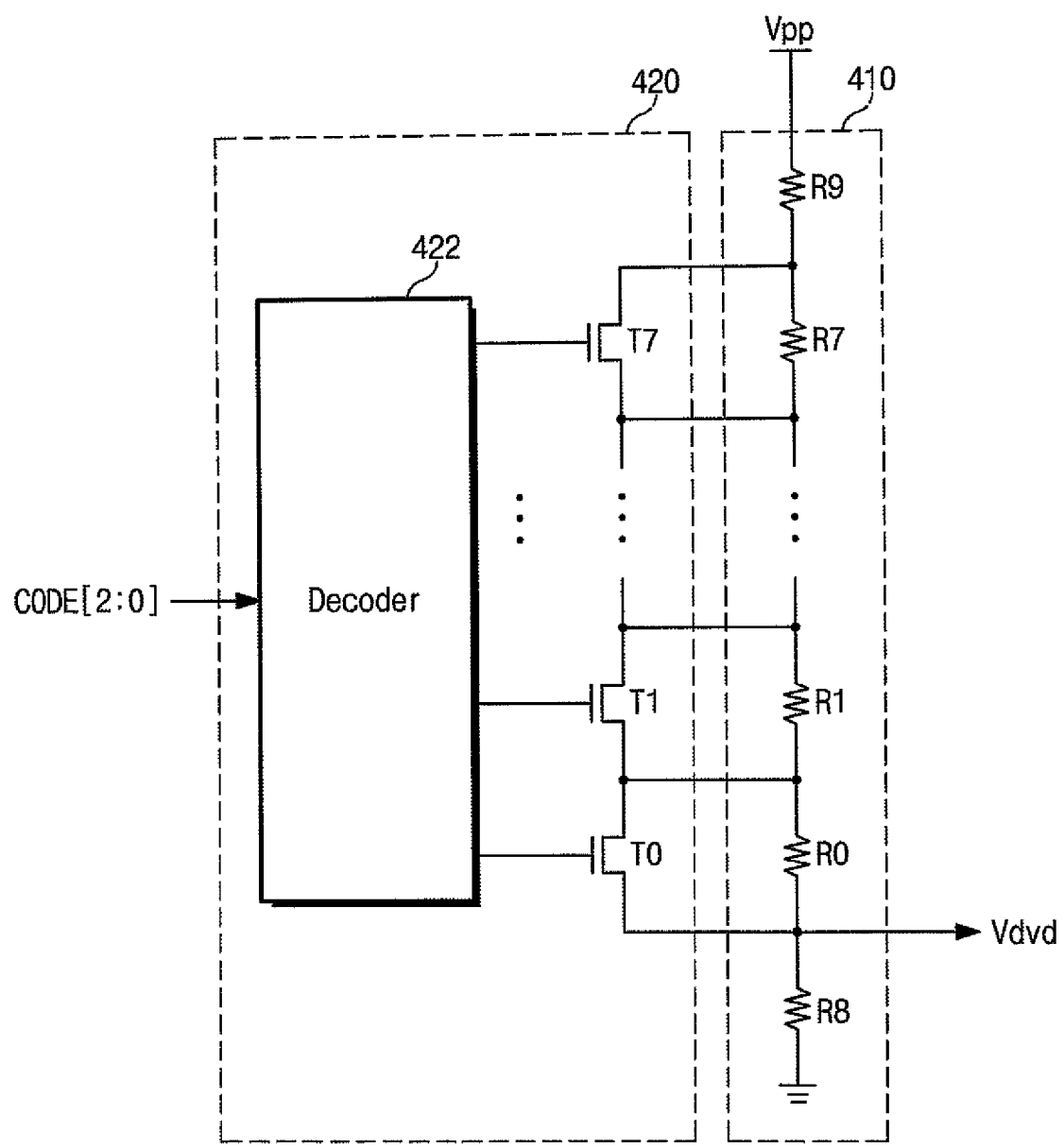
FIG. 6 is a circuit diagram further illustrating the high voltage control circuit of FIG. 5.

FIG. 6 is a circuit diagram further illustrating the high voltage control circuit 314 of FIG. 5. Referring to FIG. 6, the high voltage control circuit 314 comprises a voltage divider 410 and a division controller 420. The voltage divider 410 divides the high voltage (Vpp) under the control of the division controller 420. The division voltage (Vdvd) is provided to the comparator 316. The voltage divider 410 comprises a plurality of series0connected resistors R0 to R9. In the illustrated embodiment of FIG. 6, the resistance value of the resistor R1 is greater than that of resistor R0, the resistance of resistor R2 is greater than that of resistor R1, etc. That is, the resistance values of resistors R0 to R7 increase along the series.

The division controller 420 controls the voltage divider 410 in response to the control code (CODE[2:0]). The division controller 420 includes a plurality of transistors T0 to T7 and a decoder 422. The transistors T0 through T7 are connected to the resistors R0 to R7 of the voltage divider 410. The decoder 422 controls the transistors T0 though T7 in response to the control code (CODE[2:0]). For example, if the control code (CODE[2:0]) is '000', the decoder 422 may turn OFF transistor T0 and turn ON transistors T1 through T7. If the control code (CODE[2:0]) is '001', the decoder 422 may turn OFF transistor T1 and turn ON transistors T0, and T2 through T7, etc. Using this approach, if the resistance values of the resistors R0 to R8 dividing the high voltage (Vpp) are changed, the level of the division voltage (Vdvd) is changed accordingly. Because the comparator 316 of FIG. 5 compares the division voltage (Vdvd) with the reference voltage (Vref) to control the charge pump 312, the high voltage (Vpp) provided by the charge pump 312 is changed when the division voltage (Vdvd) is changed.

Figure 7:
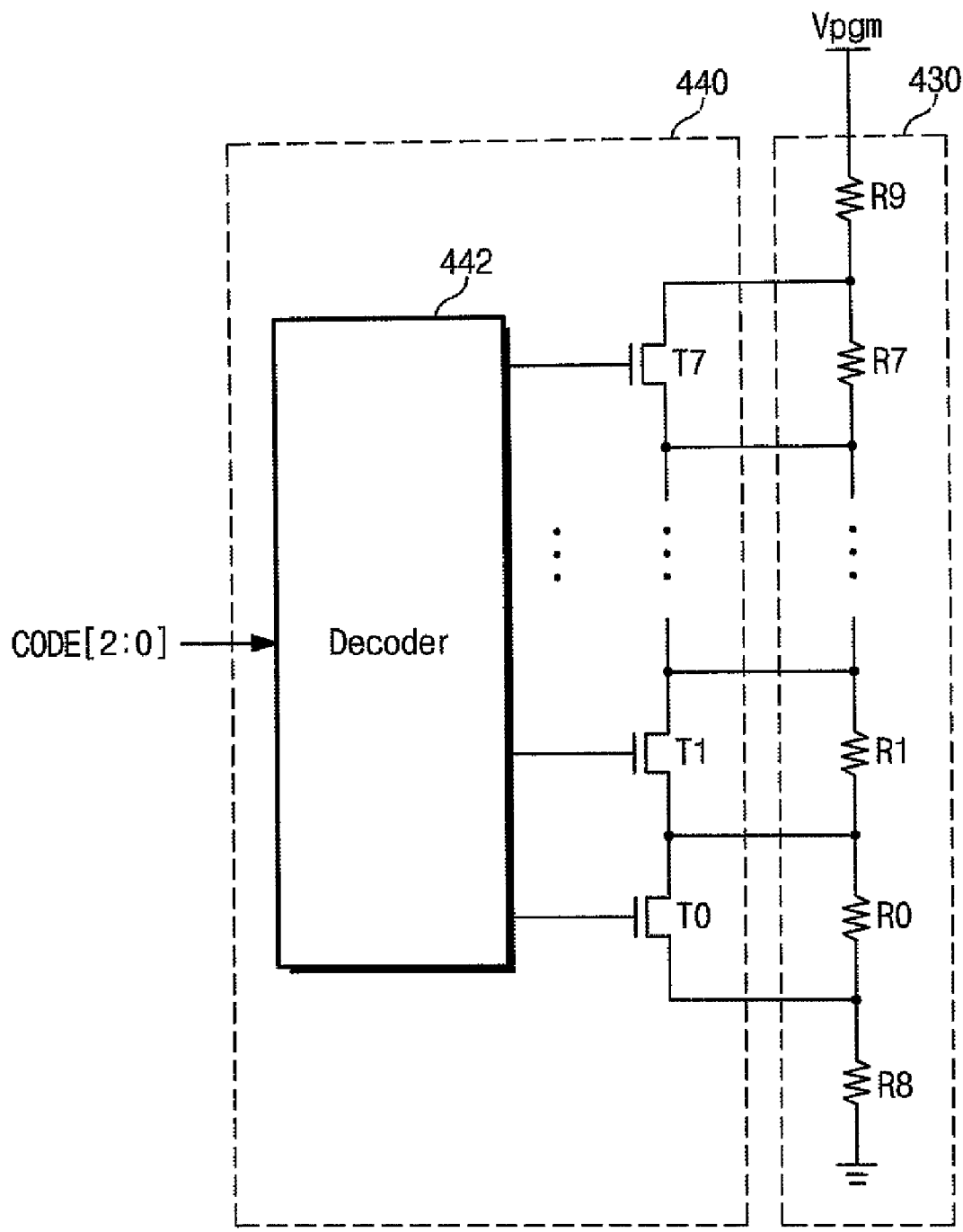
FIG. 7 is a circuit diagram further illustrating the program voltage control circuit of FIG. 5.

FIG. 7 is a circuit diagram further illustrating the program voltage control circuit 324 of FIG. 5. Referring to FIG. 7, the program voltage control circuit 324 comprises a voltage divider 430 and a division controller 440. As mentioned above, a structure of the program voltage circuit 324 may be similar to that of the high voltage control circuit 314. Accordingly, a detailed description is omitted to avoid repetition. The program voltage control circuit 324 controls a program voltage (Vpgm) provided by the voltage difference generator 322 to maintain a minimal level required for proper operation of the flash memory device 200. That is, once a program voltage (Vpgm) less than the high voltage (Vpp) by at least the voltage difference (Vd) is provided by the voltage difference generator 322, the program voltage control circuit 324 may accurately control the program voltage (Vpgm).

Hereinafter, referring to FIGS. 5 through 7, a method of controlling the generation of the high voltage (Vpp) and program voltage (Vpgm) during a program operation of the flash memory device 200 will be described.

Once a program operation starts, (e.g., an initial programming loop in the program operation is to be performed) a control code (CODE[2:0]) is applied to the high voltage generation circuit 300. It is assumed for purposes of this description that the control code (CODE[2:0]) is '000', or something similar, and selects the lowest resistance value among the plurality of resistors R0 through R7. As the program operation proceeds, (e.g., successive programming loops in the program operation are performed) the control code (CODE [2:0]) sequentially selects successively higher resistance values from the plurality of resistors.

As the appropriate control code (CODE[2:0]) is provided, the high voltage control circuit 314 divides the high voltage (Vpp) provided by the charge pump 312, and the comparator 316 compares the division voltage (Vdvd) with a reference voltage (Vref). However, because the high voltage (Vpp) is initially very low (i.e., ground voltage), the division voltage (Vdvd) will also be very low (i.e., ground voltage). Because the reference voltage (Vref) is higher than the division voltage (Vdvd), the comparator 316 generates the enable signal (EN).

In response to the enable signal (EN), the charge pump 312 begins pumping charge to develop a higher high voltage (Vpp). The high voltage control circuit 314 divides the high voltage (Vpp) in response to the currently applied control code (CODE[2:0]). Because the control code (CODE[2:0]) is initially '000', the decoder 422 turns OFF transistor T0 and turns ON transistors T1 through T7, and the division voltage (Vdvd) is divided by resistors R0, R8, and R9. The comparator 316 continues generating the enable signal (EN) until the level of the division voltage (Vdvd) rises to that of the reference voltage (Vref). By operation of the comparator 316 and high voltage control circuit 314, the high voltage (Vpp) rises to at least the minimal level required for proper operation of the flash memory device 200.

On the other hand, the voltage difference generator 322 receives the high voltage (Vpp) and provides the program voltage (Vpgm) in view of the voltage difference (Vd) and in relation to the high voltage (Vpp). The program voltage control circuit 324 turns OFF transistor T0 and turns ON transistors T1 through T7 in response to the control code (CODE[2:0]). Using resistors R0, R8, and R9, current drains from the path through which the program voltage (Vpgm) is provided. The program voltage control circuit 324 thus drains a predetermined amount of current from the path through which the program voltage (Vpgm) is provided in order to control the program voltage (Vpgm). In this manner and by operation of the voltage difference generator 322 and program voltage controller 324, the program voltage (Vpgm) is provided at a defined target level or high voltage (Vpp) minus the voltage difference (Vd).

It is now assumed that the first (or initial) programming loop in the program operation has failed to properly program all of the memory cells implicated by the program operation. Hence, a second programming loop is called for with an incrementally increased program voltage (Vpgm). At the start of the second programming loop, a control code (CODE[2:0]) having the value '001' is applied. In response to the control code (CODE[2:0]), the high voltage control circuit 314 turns OFF transistor T1 and turns ON transistors T0 and T2 through T7. Because the resulting (increased) resistance value now divides the high voltage (Vpp), the division voltage (Vdvd) is decreased. That is, because the reference voltage (Vref) is again higher than the division voltage (Vdvd), the comparator 316 generates the enable signal (EN). The charge pump 312 performs its charge pumping operation in response to the enable signal (EN). Accordingly, the level of the high voltage (Vpp) rises above the value it had during the previous (initial) programming loop.

Moreover, by operation of the voltage difference generator 322 and the program voltage control circuit 324, the level of the program voltage (Vpgm) also increases above its previous level. However, the voltage difference (Vd) between the high voltage (Vpp) and the program voltage (Vpgm) is nonetheless maintained despite increases in both voltages.

In effect, the high voltage (Vpp) is incrementally increased, similar to the program voltage (Vpgm), in response to the applied control code (CODE[2:0]). In response, the resistance value of the voltage divider 430 of the program voltage control circuit 324 is incrementally increased in response to the control code (CODE[2:0]). Because the high voltage control circuit 314 and the program voltage control circuit 324 have similar configurations and operating characteristics, the voltage divider 410 of the high voltage control circuit 314 and the voltage divider 430 of the program voltage control circuit 324 have the same resistance value during each successive programming loop in the program operation. That is, as the program voltage (Vpgm) increases, a resistance value dividing the program voltage (Vpgm) is also increased. Accordingly, because the current associated with these resistance ladders is determined on the basis of a ratio between a voltage and current, the amount of current drained from the program voltage (Vpgm) is uniformly maintained as the high voltage (Vpp) and the program voltage (Vpgm) are incrementally increased. Therefore, even if the high voltage (Vpp) and the program voltage (Vpgm) are incrementally increased, the performance characteristics exhibited by the program voltage control circuit 324 controlling the program voltage (Vpgm) does not change.

Through a similar method and in response to the same control code (CODE[2:0]), the high voltage (Vpp) and the program voltage (Vpgm) are maintained at a defined voltage difference (Vd) throughout the process of being incrementally increased. That is, while the defined voltage difference (Vd) between the high voltage (Vpp) and the program voltage (Vpgm) is maintained, the program operation is performed in the flash memory device 200.

Figure 8:
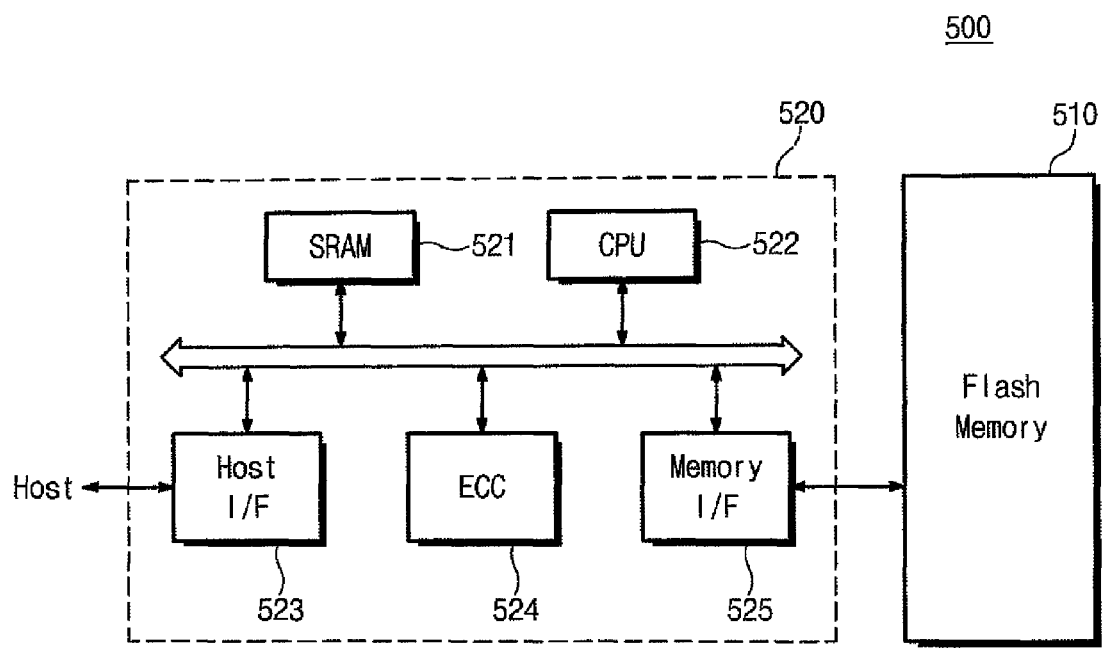
FIG. 8 is a block diagram illustrating a memory card incorporating a flash memory device according to an embodiment of the invention.

FIG. 8 is a block diagram illustrating a memory card incorporating a flash memory device according to an embodiment of the invention. Referring to FIG. 8, a memory card 500 supporting high capacity data storage comprises a flash memory device 510 according to an embodiment of the invention. The memory card 500 also comprises a memory controller 520 controlling data exchanges between an external circuit (e.g., a host device) and flash memory device 510.

SRAM 521 is used as an operating memory for a central processing unit (CPU) 522. A host interface (I/F) 523 includes a data exchange protocol of the host that is connected to the memory card 500. An error correction code (ECC) block detects and corrects potential data error(s) in read data obtained from the flash memory device 510. The memory I/F 525 interfaces with the flash memory device 510. The CPU 522 performs general control operations associated with the exchange of data with the memory controller 520. Although not illustrated in the drawings, it will be apparent to those skilled to the art that the memory card 500 may further comprise ROM (not shown) storing programming code and/or data required to control CPU 522 in its interface with the host device.

Figure 9:
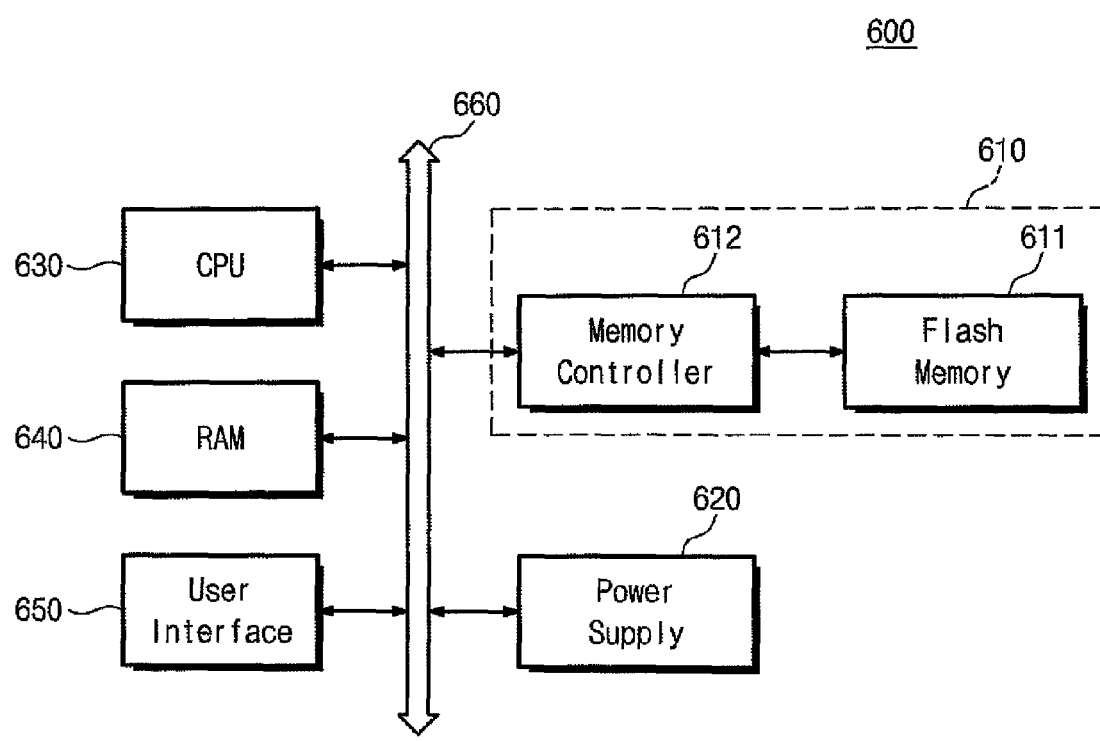
FIG. 9 is a block diagram illustrating a memory system incorporating a flash memory device according to an embodiment of the invention.

FIG. 9 is a block diagram illustrating a memory system incorporating a flash memory device according to an embodiment of the invention. Referring to FIG. 9, a memory system 600 comprises a flash memory system 610, a power supply 620, a central processing unit (CPU) 630, a random access memory (RAM) 640, a user interface 650, and a system bus 660.

The flash memory system 610 includes a memory controller 612 and a flash memory device 611. The flash memory system 610 is connected to the power supply 620, the CPU 630, the RAM 640, and the user interface 650 through the system bus 660. The flash memory device 611 stores the data provided through the user interface 650 or the data processed by the CPU 630 through the memory controller 612.

If the flash memory system 610 is mounted as a semiconductor disk device (SSD), a booting speed of the system 600 is drastically improved. Although not illustrated in the drawings, it will be apparent to those skilled in the art that the memory system according to an embodiment of the invention may further comprise an application chipset, a camera image processor, etc.

The high voltage generation circuit incorporated within embodiments of the invention utilizes the same control code to generate a high voltage (Vpp) and a corresponding program voltage (Vpgm). The high voltage control circuit and program voltage control circuit controlling the high voltage (Vpp) and the program voltage (Vpgm) in response to the code signal may have a similar configuration and operation. Because the high voltage (Vpp) and the program voltage (Vpgm) are generated by using the same control code, voltage trimming need only be performed in one circuit associated with the definition of the high voltage (Vpp) and program voltage (Vpgm). Therefore, the time required for testing the flash memory device may be reduced.

The high voltage generation circuit of the present invention maintains a stable voltage difference (Vd) between the high voltage (Vpp) and program voltage (Vpgm) using the program voltage control circuit and the voltage difference generator. Accordingly, the flash memory device prevents excess power consumption caused by maintenance of an unnecessarily elevated high voltage (Vpp) as well as possible damage to high voltage transistors within the flash memory device.

The high voltage generation circuit incorporated within some embodiments of the invention comprise a charge pump generating the high voltage (Vpp) and program voltage (Vpgm). Because the high voltage (Vpp) and the program voltage (Vpgm) are provided using a single charge pump circuit, the space required to implement the constituent flash memory device may be reduced.

The foregoing embodiments suggest use of a 3-bit control code. However, those skilled in the art will recognize that any type of control code (e.g., analog control signals or digital data bits of varying number) may be used as control code.

Similarly, the exemplary voltage divider described above include nine resistors and the corresponding division controller is applied to seven transistors. However, it will be apparent to those skilled in the art that the number of resistors in a voltage divider (assuming a voltage divider circuit is used in embodiments of the invention) as well as the number of transistors controlled by the division controller may vary between different flash memory devices.

The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A flash memory device comprising:
a memory cell array having a plurality of memory blocks;
a row decoder providing a program voltage to a selected word line;
a block selection circuit connected between the memory cell array and the row decoder to select at least one of the plurality of memory blocks; and
a high voltage generation circuit providing a high voltage to the block selection circuit and providing a program voltage to the row decoder, wherein the high voltage generation circuit comprises:
a charge pump;
a high voltage control circuit controlling the charge pump to provide the high voltage; and
a program voltage control circuit providing the program voltage in relation to the high voltage,
wherein the high voltage control circuit and the program voltage control circuit operate in response to a control code.

2. The flash memory device of claim 1, wherein the high voltage control circuit and the program voltage control circuit have a similar circuit configuration.

3. The flash memory device of claim 1, wherein the high voltage generation circuit further comprises:
a voltage difference generator receiving the high voltage and providing the program voltage by reducing the high voltage by a defined voltage difference,
wherein the program voltage control circuit receives the program voltage from the voltage difference generator and further controls the level of the program voltage.

4. The flash memory device of claim 3, wherein the high voltage control circuit and the program voltage control circuit cooperate to maintain the voltage difference between the high voltage and the program voltage in response to the control code.

5. The flash memory device of claim 4, wherein the block selection circuit comprises:
a plurality of transistors series-connected between the row decoder and the memory cell array, wherein the voltage difference is greater than the respective threshold voltages for the plurality of transistors.

6. The flash memory device of claim 5, further comprising control logic controlling the execution of a program operation in the flash memory wherein during a program operation,
wherein the high voltage control circuit and the program voltage control circuit respectively increment the high voltage and program voltage in response to the control code, such that the voltage difference between the high voltage and program voltage is maintained throughout the program operation.

7. The flash memory device of claim 5, wherein the high voltage generation circuit further comprises a comparator comparing a division voltage provided by the high voltage control circuit with a reference voltage and controlling operation of the charge pump in relation to the comparison.

8. The flash memory device of claim 7, wherein the program voltage control circuit cause current to be drained from a path through which the program voltage is provided in order to control the level of the program voltage.

9. The flash memory device of claim 8, wherein the high voltage control circuit comprises:
a first divider dividing the high voltage and providing the resulting division voltage to the comparator; and
a first division controller controlling the first divider in response to the control code.

10. The flash memory device of claim 9, wherein the program voltage control circuit comprises:
a second divider causing current to be drained from the path through which the program voltage is provided; and
a second division controller controlling the second divider in response to the control code,
wherein the first and second dividers have a similar circuit configuration.

11. The flash memory device of claim of 5, wherein the voltage difference is variably controllable.

12. The flash memory device of claim 11, wherein the voltage difference generator comprises a plurality of series-connected diodes, each diode in the plurality of series-connected diodes being selectively activated in response to the control code.

13. A method of controlling the generation of a high voltage and corresponding program voltage in a flash memory device, the method comprising:
generating the high voltage higher than a power supply voltage in response to received control code;
deriving the program voltage from the high voltage with a defined voltage difference between the program voltage and high voltage in response to the control code, wherein the voltage difference is variably controllable and the program voltage is defined in relation to the high voltage by controlling an amount of current drained from a path through which the program voltage is provided; and
incrementally increasing the high voltage and the program voltage while maintaining the voltage difference in response to the control code.

14. A memory system comprising:
a memory controller configured to provide a control signal and further configured to control the operation of a flash memory device,
wherein the flash memory device comprises:
control logic receiving the control signal and generating corresponding control code;
a memory cell array having a plurality of memory blocks;
a row decoder providing a program voltage to a selected word line;
a block selection circuit connected between the memory cell array and the row decoder to select at least one of the plurality of memory blocks; and
a high voltage generation circuit providing a high voltage to the block selection circuit and providing a program voltage to the row decoder, wherein the high voltage generation circuit comprises:
a charge pump;
a high voltage control circuit controlling the charge pump to provide the high voltage in response to the control code; and
a program voltage control circuit providing the program voltage in relation to the high voltage in response to the control code.

15. The memory system of claim 14, wherein the high voltage control circuit and the program voltage control circuit have a similar circuit configuration.

16. The memory system of claim 14, wherein the flash memory device and the memory controller are integrated onto a memory card.

17. The memory system of claim 14, wherein the memory controller and the flash memory device forms a solid state drive (SSD).

* * * * *